(12) United States Patent
Breese et al.

(10) Patent No.: US 9,791,774 B2
(45) Date of Patent: Oct. 17, 2017

(54) NANOSTENCIL MASK AND METHOD FOR FORMING A NANOSTENCIL MASK

(71) Applicant: NATIONAL UNIVERSITY OF SINGAPORE, Singapore (SG)

(72) Inventors: Mark Brian Howell Breese, Singapore (SG); Sara Azimi, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 257 days.

(21) Appl. No.: 14/686,943

(22) Filed: Apr. 15, 2015

(65) Prior Publication Data

US 2015/0293450 A1    Oct. 15, 2015

Related U.S. Application Data

(60) Provisional application No. 61/979,582, filed on Apr. 15, 2014.

(51) Int. Cl.
| | | |
|---|---|---|
| G03F 7/12 | (2006.01) |
| G03F 7/38 | (2006.01) |
| G03F 7/00 | (2006.01) |
| B32B 3/26 | (2006.01) |

(52) U.S. Cl.
CPC ............ G03F 7/0015 (2013.01); B32B 3/266 (2013.01)

(58) Field of Classification Search
None
See application file for complete search history.

(56) References Cited

U.S. PATENT DOCUMENTS 5,882,953 A * 3/1999 Tu .................. H01L 21/2652
257/E21.327
6,885,078 B2 * 4/2005 Bartlett ............ H01L 21/26513
257/133

* cited by examiner

*Primary Examiner* — Stephen Rosasco
(74) *Attorney, Agent, or Firm* — Marshall, Gerstein & Borun LLP

(57) ABSTRACT

The present disclosure relates to a method for forming a nanostencil mask. The method involves irradiating a substrate to increase resistivity of a plurality of first portions of the substrate relative to one or more second portions of the substrate surrounding the plurality of first portions. The method also involves passing a current through the substrate, the current preferentially passing through and weakening the one or more second portions of the substrate. This preference is a result of the higher resistivity in the one or more first portions of the substrate causing the current to pass through the relatively lower resistivity second portion(s). The method also involves subjecting the substrate to a material removal process, the material removal process preferentially removing the weakened one or more second portions of the substrate and thereby forming a nanostencil mask comprising the plurality of first portions of the substrate.

20 Claims, 12 Drawing Sheets

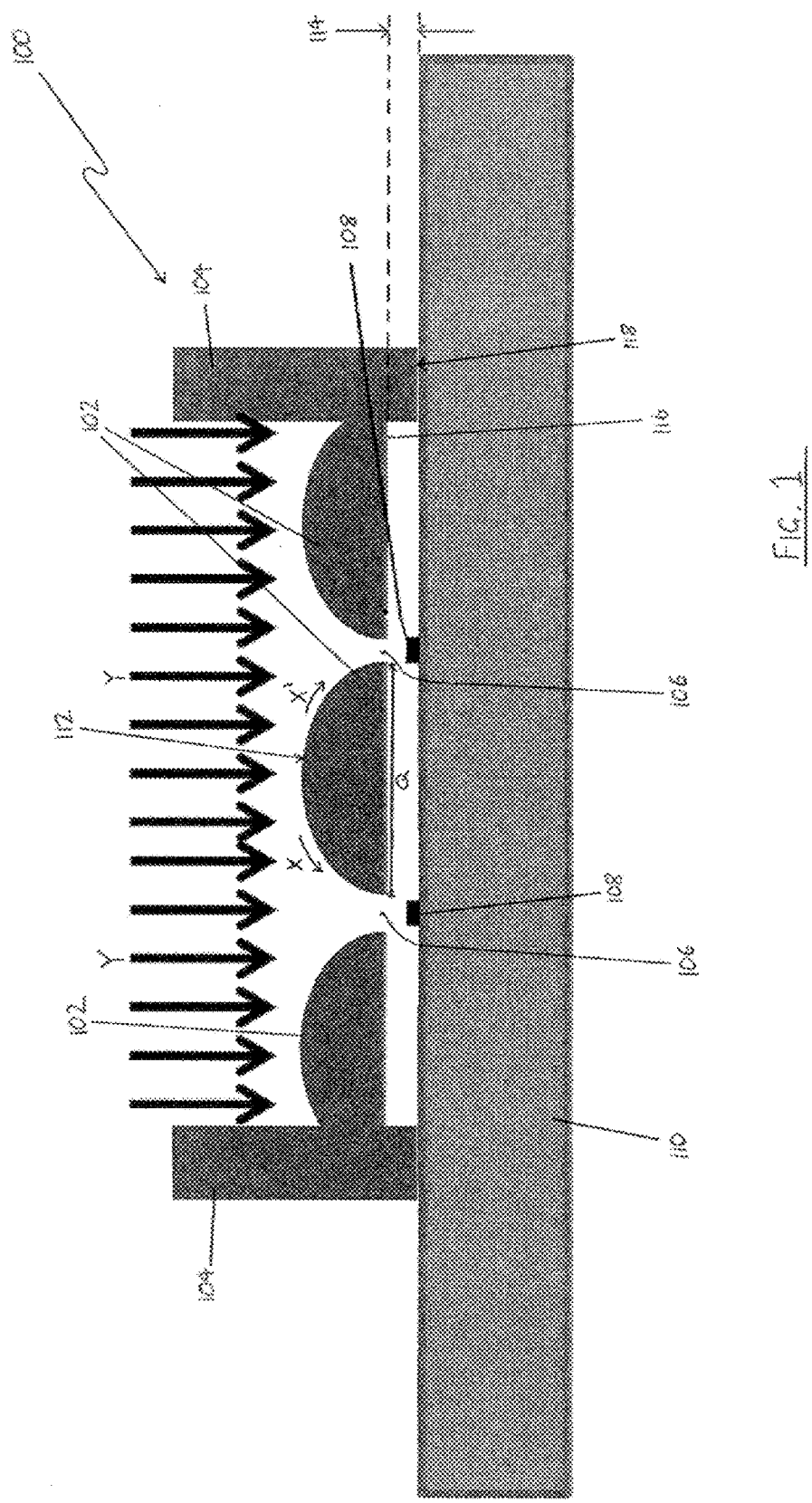

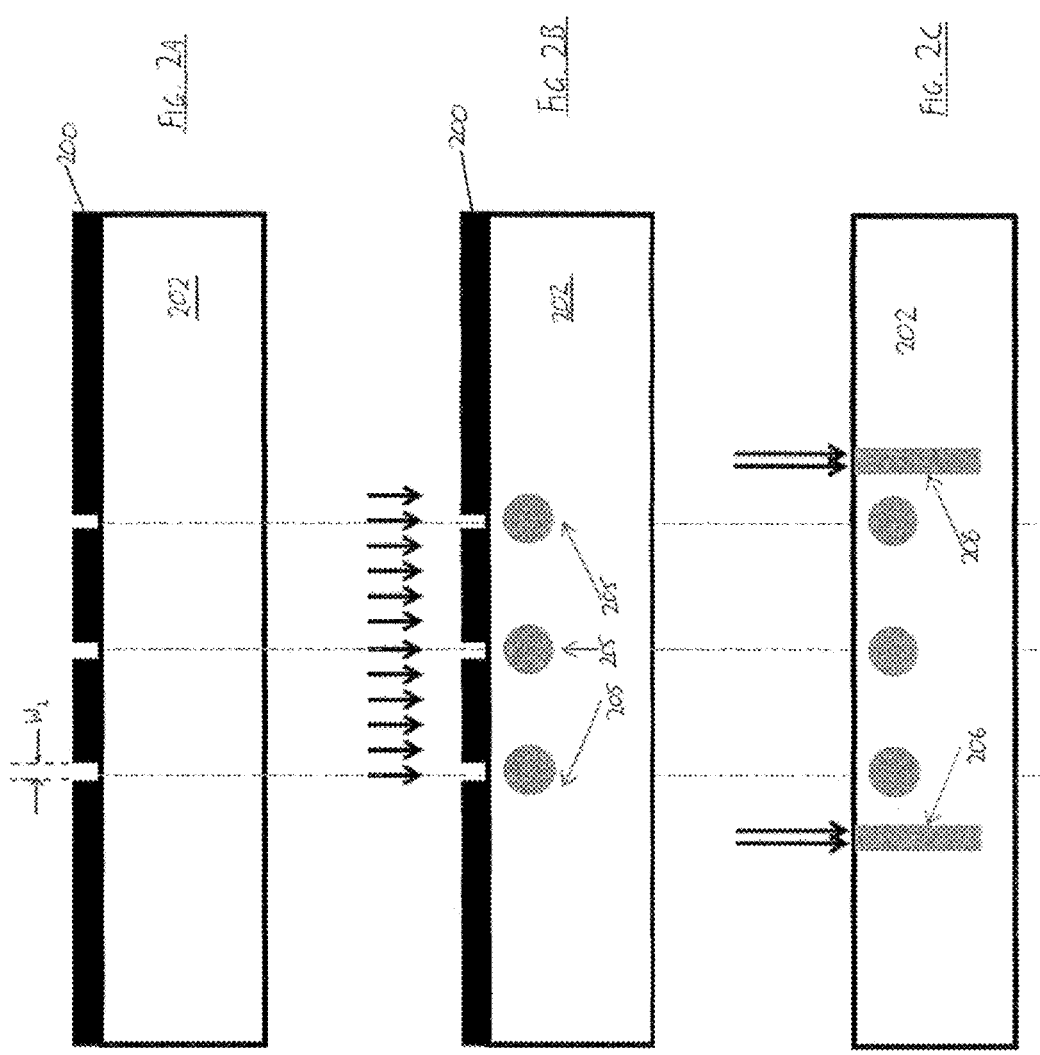

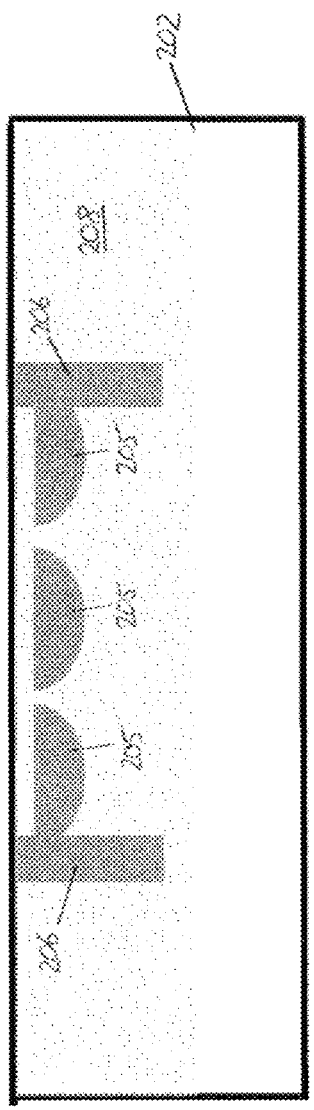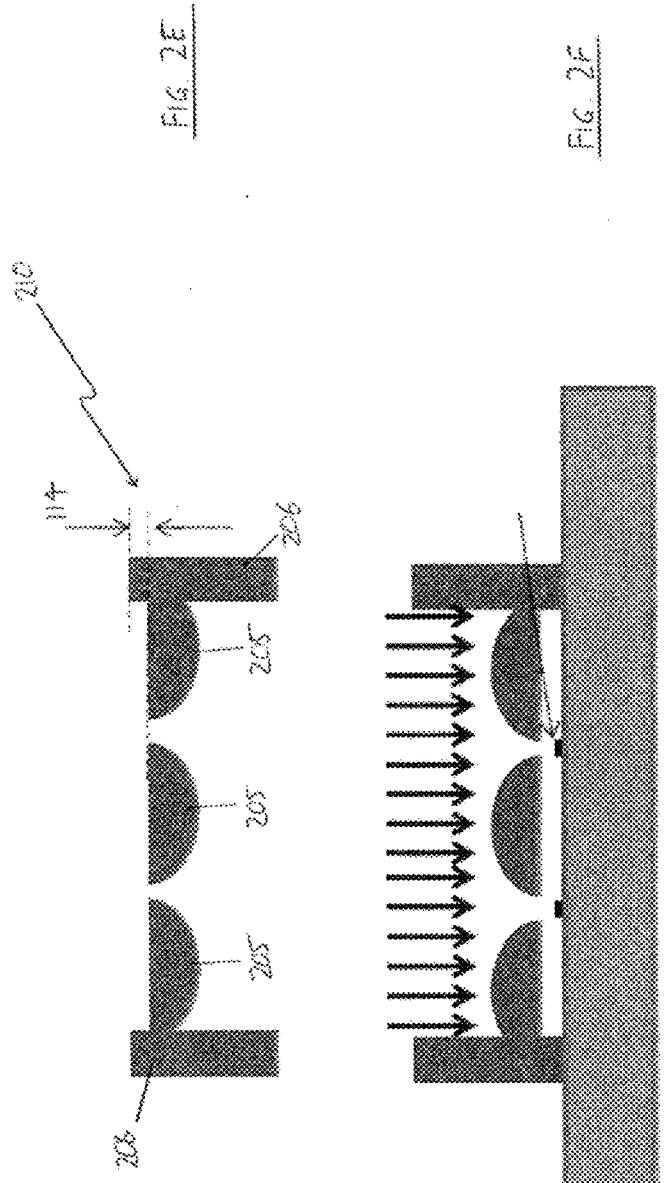

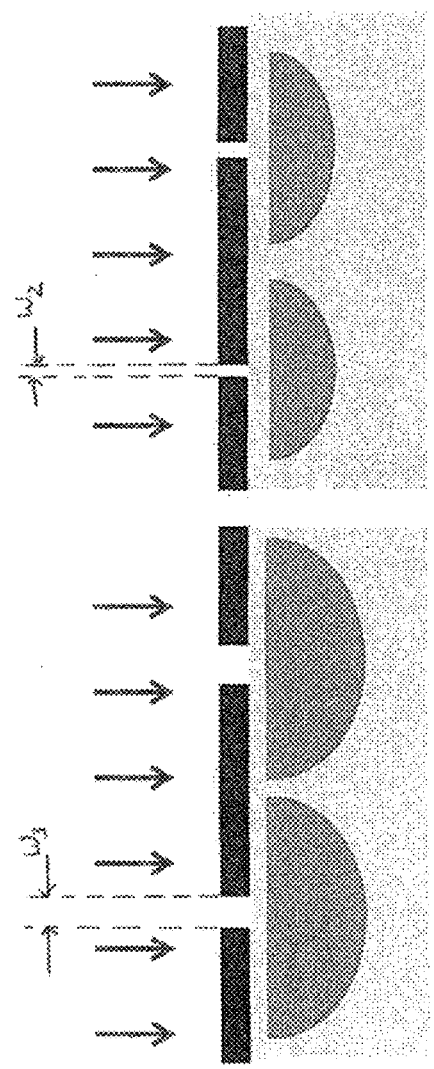

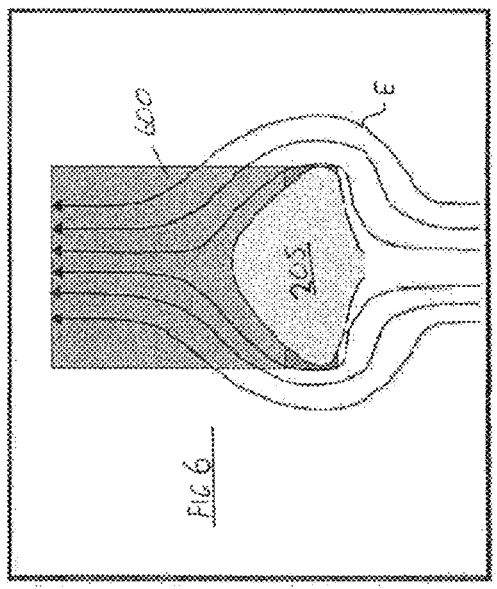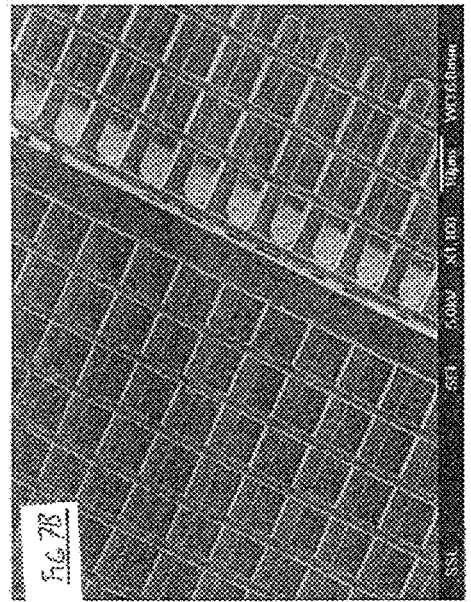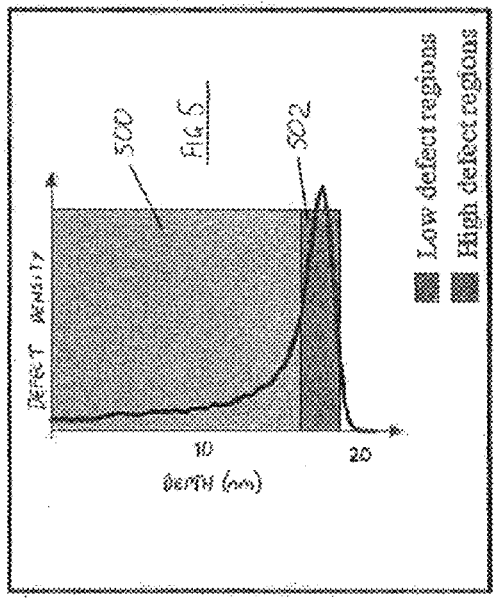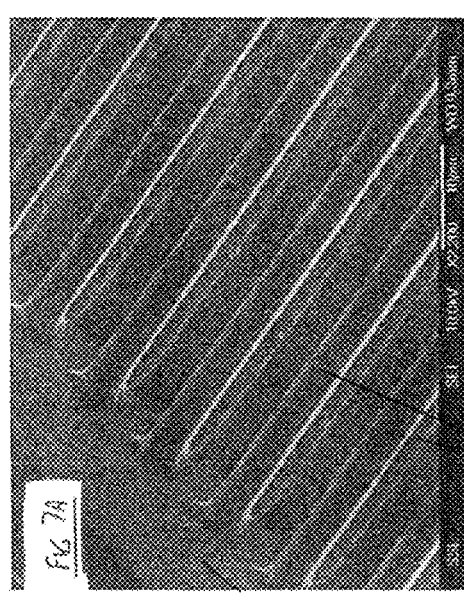

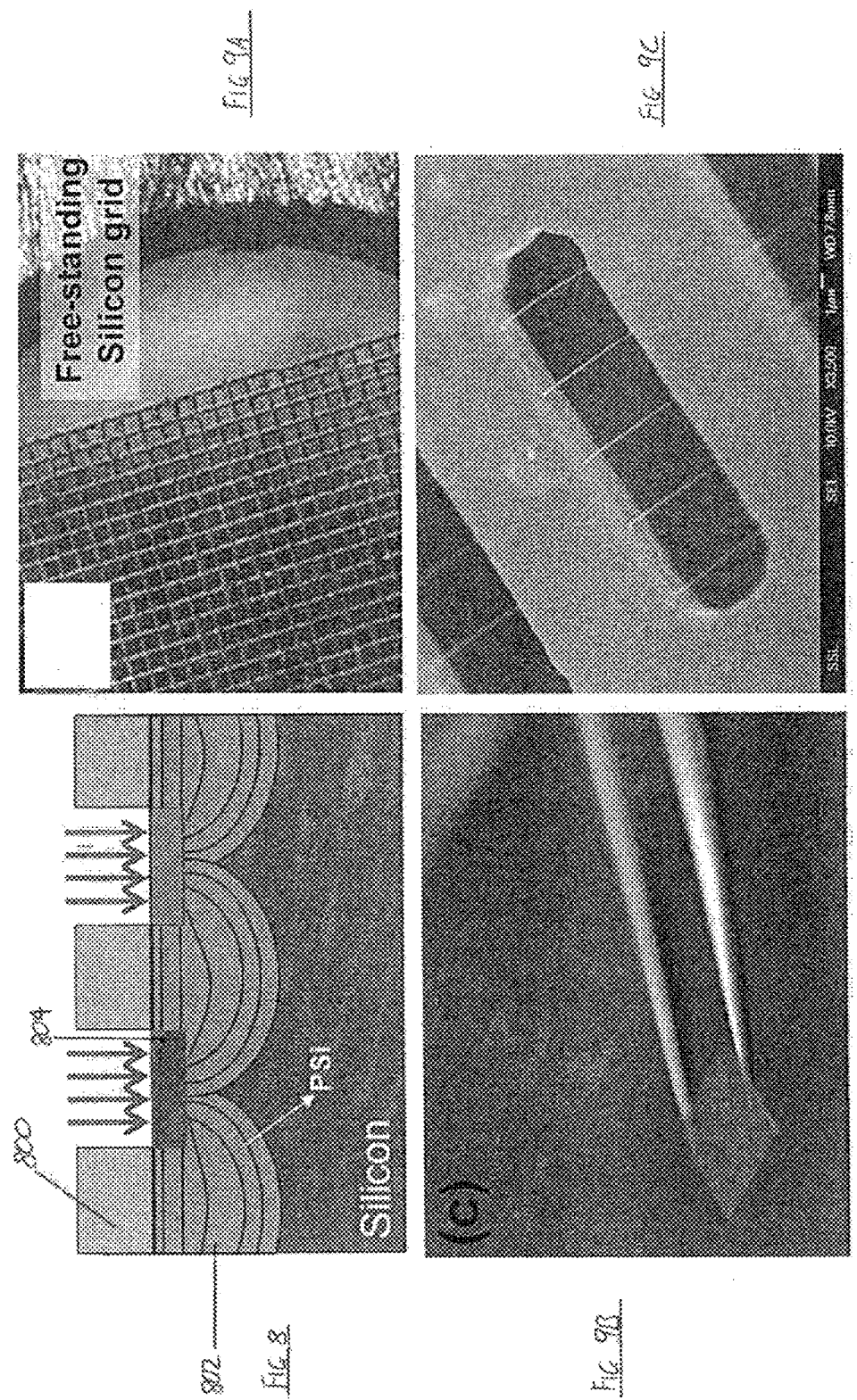

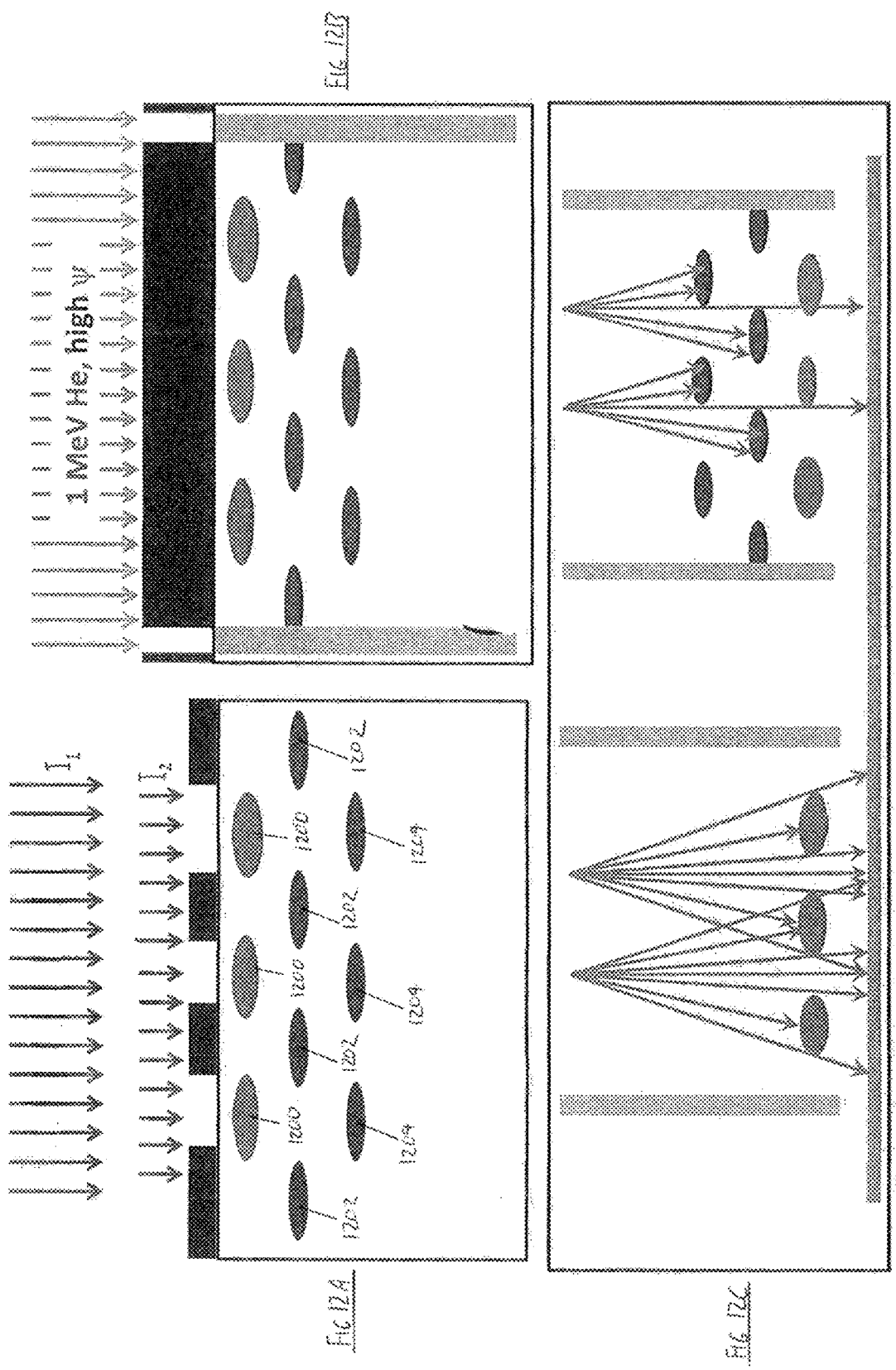

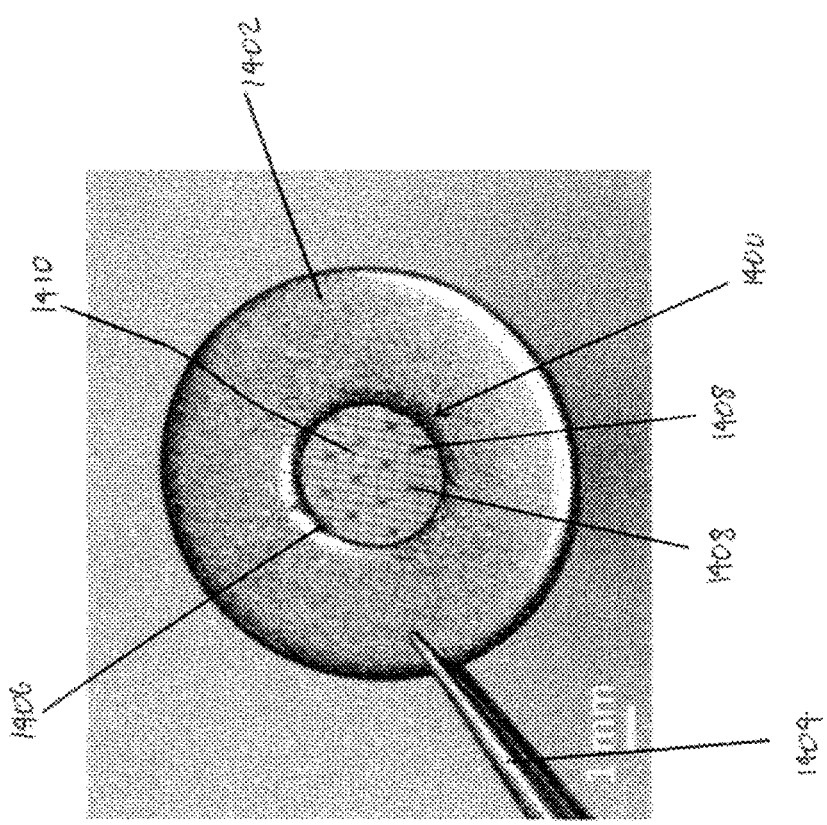

NANOSTENCIL MASK AND METHOD FOR FORMING A NANOSTENCIL MASK

TECHNICAL FIELD

The present disclosure relates to nanostencil masks and, in particular, to a method for forming a nanostencil mask.

BACKGROUND

Nanostencil lithography is a substrate patterning method based on shadow mask evaporation. Typically, a thin silicon nitride membrane is used as a solid mask to transfer the pattern to the substrate during a single step of contact or close proximity evaporation.

Nanostencil lithography is simpler than conventional lithography processes since it requires no photoresist deposition, patterning and removal. Nanostencils are also potentially reusable many times to reproduce the same pattern in a number of substrates.

The thin silicon nitride membranes used for nanostencil lithography must be supported, and support is typically achieved by suspending the membrane in a thick silicon wafer structure. A pattern is then formed in the membrane using ion beam sputtering, reactive ion etching and electron beam lithography. This process affords the creation of pattern apertures of down to around 50 nm.

The minimum aperture size is generally proportional to the thickness of the silicon nitride membrane. In other words, for a 50 nm aperture the silicon nitride membrane should be around 50 nm thick. Silicon nitride curls and buckles under thermal stress. As a result, smaller apertures are more susceptible to curling and buckling during formation, and subsequently by material deposition during pattern transfer.

This curling and buckling blurs the aperture size and shape.

It is also difficult to control the distance between the stencil and substrate to which the pattern is being transferred. This lack of control can degrade transfer pattern resolution. While distance control is difficult, it is further hindered by curling and buckling of the apertures.

It is desirable, therefore, that a nanostencil and method for forming a nanostencil be provided that afford the creation of smaller apertures than those reproducibly achievable using prior art nanostencils, remedy one or more of the deficiencies of prior art nanostencils, or at least provide a useful alternative.

SUMMARY

In accordance with a first aspect of the present disclosure, there is provided a method for forming a nanostencil mask, comprising:
  irradiating a substrate to increase resistivity of a plurality of first portions of the substrate relative to one or more second portions of the substrate surrounding the plurality of first portions;
  passing a current through the substrate, the current preferentially passing through and weakening the one or more second portions of the substrate; and
  subjecting the substrate to a material removal process, the material removal process preferentially removing the weakened one or more second portions of the substrate and thereby forming a nanostencil mask comprising the plurality of first portions of the substrate.

Removal of the one or more second portions of the substrate may result in at least one aperture being formed between first portions of the plurality of first portions.

The plurality of first portions of the substrate may each form a bar. Each bar may be a silicon bar.

The substrate may be, for example, a silicon wafer. If the substrate is a silicon wafer then "weakening one or more second portions of the substrate" may involve, for example, forming porous silicon in the one or more second portions of the silicon wafer.

The step of subjecting the substrate to a material removal process may use any known process appropriate in light of present teachings. For example, the step of subjecting the substrate to a material removal process may involve dissolving the one or more second portions of the substrate in solution.

The irradiating step may be performed by any method appropriate in light of present teachings. For example, the irradiating step may involve irradiating the substrate through a pattern of a patterned resist layer. Where the irradiating step involves irradiating the substrate through a pattern of a patterned resist layer, the width of features (e.g. recesses, indentations, etched regions and the like) of the pattern of the patterned resist layer may be used to influence an irradiation line fluence of irradiation used in the irradiating step.

The irradiating step can be controlled to achieve a desired nanostencil design. For example, the irradiating step may involve controlling an irradiation line fluence to control a size of each first portion in the plurality of first portions of the substrate. The irradiation line fluence may also be controlled to control a size of a gap between neighboring ones of the plurality of first portions of the substrate. In the case where irradiation is controlled to control a gap size, the gap size can be controlled such that the gap forms an aperture in the nanostencil mask, and the gap has a width of, for example, 10 nm.

In accordance with a second aspect of the present disclosure there is provided a nanostencil mask formed using the method of the first aspect, wherein the plurality of first portions form substantially semi-circular members. In other words, the cross-section of the first portions is semi-circular.

As used herein, the term "fluence" as applied to ion irradiation is intended to mean the number of ions incident on a given surface area: units ions/cm$^2$. This definition is ideal for the traditional irradiation of large areas where the effects of irradiation are laterally uniform.

Where the irradiated surface line width (irradiated surface lines may be used to form the plurality of first portions) is similar to, or smaller than, the size of the ion lateral straggling effect at the end-of-range, the average defect density within the end-of-range region decreases compared to that for an irradiated large area, for a fixed fluence. Due to the inability to accurately apply the standard definition for "fluence" to irradiated surface lines, a more useful parameter in the present case is "line fluence".

The term "line fluence" is intended to refer to the number of ions used for irradiating a line of zero width per centimeter of line length. This definition is more useful in defining the effect of ion irradiation on the resultant bar size—i.e. the size of each of the plurality of portions. The line fluence is independent of the irradiated line width on the surface. Moreover, the line fluence simplifies the experimental aspects of fabricating bars, particularly small bars, since the only parameters to be determined are the total number of ions used, the energy of those ions and the type of ions.

The terms "nanostencil pattern transfer process", "pattern transfer", "material deposition" and similar will be taken to mean processes employing the fabricated nanostencil mask, whereby material is deposited onto a substrate through the nanostencil mask in order to transfer the pattern from the mask to the substrate.

BRIEF DESCRIPTION OF THE DRAWINGS

Preferred embodiments will now be described by way of non-limiting example only, with reference to the accompanying drawings, in which:

FIG. 1 is a schematic of a nanostencil in accordance with present teachings, in use during a material deposition process;

FIGS. 2A to 2F are schematics of a method in accordance with present teachings for fabricating nanoscale stencil masks, where FIG. 2A shows depositing and patterning a 1 um thick e-beam resist patterned with line widths of 90 nm, FIG. 2B shows low energy (50 keV) proton irradiation to transfer the pattern to the substrate to damage or cause defects in the substrate, FIG. 2C shows high energy (e.g. 1 MeV proton), high fluence irradiation pattern transferal for creating coarse supporting features in the substrate, FIG. 2D shows the result of electrochemical anodization of the substrate in dilute HF electrolyte, to a depth beyond the end-of-range of the coarse supporting features, FIG. 2E shows the thin, patterned nanostencil mask with the porous silicon removed, and FIG. 2F shows the nanostencil in a 'use' position, inverted onto a substrate;

FIGS. 3A and 3B schematically compare the effects of a wider (180 nm) and a narrower (90 nm) line widths formed using electron-beam lithography in a resist layer;

FIG. 5 shows defect density versus depth (in a silicon substrate) for 1 MeV protons;

FIG. 6 is a schematic of the anodization hole current deflected around end-of-range regions;

FIGS. 7A and 7B show nanostencil masks produced using methods in accordance with the present teachings;

FIG. 8 is a schematic of the production of an undercut for detaching a silicon microstructure;

FIGS. 9A to 9C show free-standing silicon grids formed using a method in accordance with present teachings;

FIGS. 12A to 12C show an method for fabricating a 3-dimensional nanostencil mask comprising multiple layers of bars or fine mask features;

FIG. 14 is a magnified view of a nanostencil mask formed in accordance with the present disclosure.

DETAILED DESCRIPTION

Figure 4:
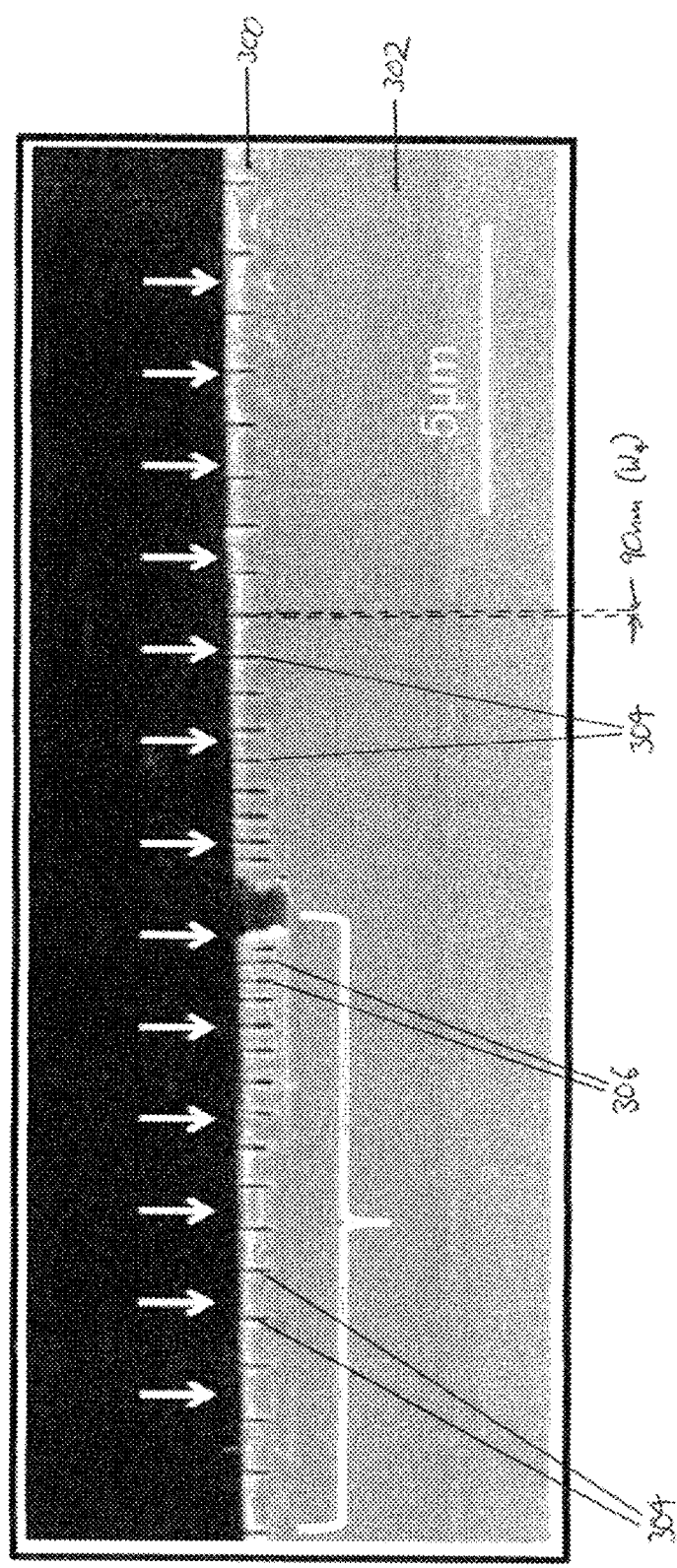
FIG. 4 cross-section view of a 1 μm thick e-beam patterned resist with line widths of 90 nm.

FIG. 1 shows a nanostencil mask 100 in accordance with present teachings. The mask 100 comprises fine mask portions, presently embodied by fine mask features 102, and support structure portions, presently embodied by coarse structural features 104.

The size of the fine mask features 102 and the spacing between them is largely responsible for defining the size of apertures 106 in the mask 100, and consequently the size of the features 108 deposited onto a nano-product substrate 110 during subsequent pattern transfer.

The fine mask features 102 have a rounded surface 112 as a result of the nanostencil mask formation process. Presently, the rounded surface 112 imparts a semicircular shape to the respective fine mask feature 102. The semicircular shape extends in a longitudinal direction of the respective fine mask feature 102. The present fine mask features 102 form elongate bars having a longitudinal direction extending into the page of FIG. 1. The rounded shape of the fine mask features 102 contrasts with the squarer of traditional nanostencil mask features.

Traditional nanostencil masks attempt to provide vertical aperture sidewalls extending perpendicularly from, and between, the top surface and bottom surface of the silicon nitride membrane (or other substrate). Traditional nanostencil mask apertures can unintentionally widen towards the bottom surface as a result of ions scattering during aperture formation. During pattern transfer, material can collect on the top surface and can hinder passage of material as deposition continues, which can ultimately obscure the apertures and degrade pattern transfer accuracy.

The semicircular shape of fine mask features 102 of the present embodiment means that material deposited (in the direction of arrows Y) on the top, rounded surface 112 of the fine mask features 102 tends to move towards the apertures 106 as indicated by arrows X and X', to thereby be deposited onto the nano-product substrate 110. There is therefore a reduced likelihood of apertures 106 being obscured when compared with the likelihood during pattern transfer using a traditional nanostencil mask.

The size of the apertures 106 is dependent on the size of the fine mask features 102, the center-to-center distance between those features 102 and the center-to-center distance between fine mask features 102 and coarse structural features 104. The reason the 'center-to-center distance' is a useful parameter in that the process for forming the nanostencil mask 100 involves growing the fine mask features 102 towards each other until the apertures 106 are reduced to the desired size.

The coarse structural features 104 are support features. These features 104 support the fine mask features 102 and maintain the relative positions of the fine mask features 102. In effect, the fine mask features 102 are suspended by the coarse structural features 104, which serve to maintain the relative positions of the fine mask feature 102 and also enable easy handling and usage of the nanostencil mask 100. The coarse structural features 104 may also form bars and may also be elongate.

The coarse structural features 104 have a rectangular cross-section. However, any desired shape may be used provided it is suitable for application of the fabrication process described herein.

The present embodiment shows a gap 114 between the bottom surface 116 of the fine mask features 102 and the bottom edges 118 of the coarse structural features 104. The size of the gap 114 can be controlled, and may be as large as 100 nm or as small as zero (i.e. no gap). This means that the apertures 106 of the nanostencil mask 100 can be positioned at a predefined, known distance from the substrate 110. Knowing the distance between the nanostencil mask 100 and substrate 110 can serve to diminish or eliminate blurring during pattern transfer, or maintain blurring at an acceptable level.

Notably, since the fine mask features 102 increase in diameter (dimension Q) in order to reduce the size of apertures 106, the distance between apertures 106 increases as the apertures 106 reduce in size. Thus the likelihood that blurring will result in cross-talk or interference between features 108 deposited during pattern transfer decreases as the size of the apertures 106 decreases.

There are various methods in accordance with present teachings for producing nanostencil mask 100. With reference to FIGS. 2A to 2E, such methods may involve:

fabricating a resist layer 200 on a substrate 202—see FIG. 2A;

irradiating the substrate 202 through the resist layer 200 to form fine mask features 205—it will be appreciated that, in this context, irradiating the substrate 202 may not involve irradiating the substrate 202 in its entirety—see FIG. 2B;

irradiating the substrate 202 to form coarse structural features 206—see FIG. 2C;

passing a current through the substrate 202 to weaken one or more second portions of the substrate 202—a the second portions comprise material 208 of the substrate 202 around the fine and coarse features 205, 206 the removal of which would free the fine and coarse features 205, 206 for use as a nanostencil mask—see FIG. 2D; and applying a material removal process to remove the remainder 208 of the substrate 202, leaving behind the fine and coarse features 205, 206 freed from the substrate 202—see FIG. 2E.

There are a number of processes available for fabricating resist layers 200. The present resist layer 200 is spin-coating onto the substrate 202. The resulting resist layer 200 is around 1 μm thick. However, other thicknesses may be used as suitable for a particular nanostencil mask.

The resist is a polymethyl methacrylate (PMMA) resist. However, any other appropriate resist may be used.

After formation on the substrate 202, the resist layer 200 is patterned. Patterning can be achieved various ways. The present pattern features 204 are formed using electron-beam lithography. Electron-beam lithography is controllable to form predetermined feature widths W and depths D.

Notably, while the pattern features 204 extend through the full thickness of the resist layer 200 and thus have a depth D equal to the thickness of the resist layer 200, pattern features may be formed that extend less than the full depth of the resist layer 200.

FIG. 2A shows the resist layer 200 with pattern features 204 already formed therein. It will be understood that such features are formed in the resist layer 200 after it has been fabricated (e.g. spin-coated onto substrate 202).

The pattern features 204 are around 100 nm wide. The pattern features 204 are typically lines of width $W_1$. The width $W_1$ of the features 204 is adjustable to control an irradiation line fluence and thereby control the size of features 205, 206. By increasing the width $W_1$ of the pattern features more ions irradiate the substrate and the size of the features 205, 206 increases. For example, with reference to FIG. 3B, a line width $W_2$ of 90 nm will allow fewer ions through the resist 200 and into the substrate 202, and thus result in finer fine mask features 205. Conversely, a line width $W_3$ of 180 nm, as shown in FIG. 3A, will allow more ions through and result in wider fine mask features 205.

When compared with the 90 nm line widths $W_2$ of FIG. 3B, the 180 nm line widths $W_3$ of FIG. 3A result in a factor of two difference in line fluence and so changes the width of the silicon bars. FIGS. 3A and 3B therefore show that there is a process for controlling aperture size between adjacent bars.

A patterned resist layer 300 is shown in FIG. 4, atop a substrate 302. The resist layer 300 is a 1 μm thick PMMA resist. The resist 302 is patterned using electron-beam lithography with line widths $W_4$ of 90 nm. Some of the lines 304 extend only partway through the resist 300, whereas other lines 306 extend the full depth of the resist 300. As a result of uniform ion irradiation, the plurality of first portions (i.e. fine and coarse features 205, 206) will be formed at a shallower depth of the substrate 302 through lines 304, than through lines 306. In this manner, the gap 114 can be controlled by controlling the penetration depth of the lines 304, 306.

With reference to FIG. 2B, once the resist layer 200 has been patterned, the substrate 202 is irradiated through the resist layer 200 to form fine mask features 205. Irradiation is performed using ion irradiation. The ion irradiation found to be generally suitable for formation of fine mask features 205 uses ions with an ion energy of around 50 keV or less. This is because 50 keV protons have a range of about 470 nm in a silicon wafer—one candidate material from which the substrate 202, and thus the nanostencil mask, may be formed—and about 820 nm in PMMA. Thus a 1 μm thick PMMA layer 200 is sufficient to prevent penetration of 50 keV ions into the substrate 202 outside of the pattern features 204. The ion energy and resist layer thickness may be selected to suit a particular application.

Irradiating the substrate 202 results in the formation of defects in the substrate 202. The defects are formed in the plurality of first portions of the substrate (i.e. fine mask features 205 and coarse structural features 206). Those portions provide the fine mask features 205. Portions of the substrate 202, particularly a silicon wafer substrate (e.g. p-type silicon), that have higher defect density also have higher resistivity. Many types of defects effectively increase the resistivity of a p-type silicon along the trajectories of ions during ion irradiation. As a result, if a current is applied to the substrate it will preferentially pass through other, less defect dense parts of the substrate 202.

The defects forming the fine mask features 205 are concentrated at an end-of-range region of the ion irradiation. With reference to FIG. 5 the defect production rate of light ions, such as protons and helium ions, with energies of about 50 keV or higher (FIG. 5 shows defect production for protons with an energy of around 1 MeV), peak as the ion approaches the maximum penetration distance into the substrate (i.e. the end-of-range). Thus, protons travelling through the pre-end-of-range region (low defect region 500), while producing some defects, do not cause a particular high defect concentration when compared with defects formed in the end-of-range region (high defect region 502).

If a low fluence line is irradiated on the substrate surface, a bar (e.g. a fine mask feature 205) will thus be formed along the line, but only at or around the end-of-range depth of the trajectories of the irradiating ions. Increasing line fluence (e.g. by widening the pattern features 204) produces bars that are both wider and taller than for lower fluence irradiation.

Figure 11:
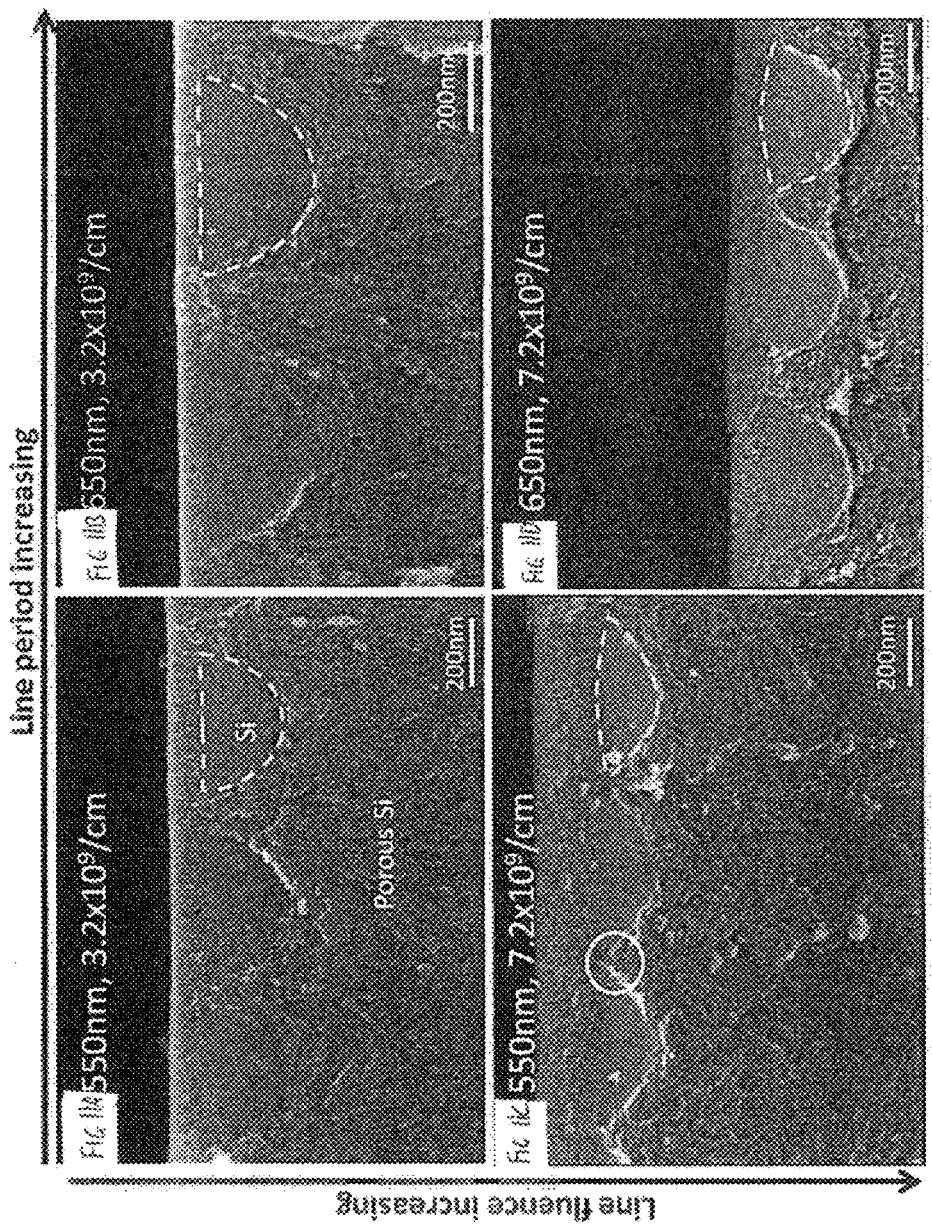
FIGS. 11A to 11D show cross-sections of substrates for different irradiation line period and line fluences.

This phenomenon is illustrated in FIGS. 11A to 11D, which shows cross-sections of individual bars in 0.02 Ω·cm p-type silicon wafer, irradiated with 50 keV protons with periods of:

FIGS. 11A and 11C—550 nm
FIGS. 11B and 11D—650 nm and line fluences of:
FIGS. 11A and 11B—3.2×10$^9$/cm
FIGS. 11C and 11D—7.2×10$^9$/cm.

The right-most bar profile is highlighted in each of FIGS. 11A to 11D, with a dashed white line in each case. For illustrative purposes, the white circle in FIG. 11C indicates a 50 nm aperture.

Ions with higher energies scatter more readily than those with lower energies. The larger scattering of ions at higher energies results in defects distributed over a larger lateral distance away from the axis of the irradiation (e.g. the ion beam). Therefore, to fabricate small diameter bars (e.g. fine mask features 205), a lower irradiation energy is preferable.

Importantly, the defects caused by irradiation spread laterally outwardly from the irradiation beam trajectory. Thus, while the irradiated lines produce silicon bars 205, the distance between those bars 205 can be made controllably small by adjusting irradiation line fluence, spacing between pattern features 204, current density used when electrochemically anodizing the substrate, and other factors.

With reference to FIG. 2C, unless the fine mask features 205 are made particularly thick, they will not be self-supporting once the surrounding material 208 (see FIG. 2D) of the substrate 202 has been removed. To form a useable nanostencil mask, the fine mask features 205 should be suspended in a coarser, more rigid, thicker supporting structure. Therefore, after forming the fine mask features 204, the substrate 202 is irradiated to form coarse structural features 206.

Formation of the fine mask features 205 will typically require a different irradiation to formation of the coarse structural features 206. To this end, irradiation may involve more than one irradiation process resulting in the formation of the different features 205, 206. For example, irradiation may involve a first irradiating process in which the substrate 202 is irradiated using ions of a first energy level to form the fine mask portions 205 and a second irradiating process in which the substrate 202 is irradiated using ions of a second energy level to form the support structure portions 206. In general, the second energy level will be higher than the first energy level. Also, the various irradiating processes can be performed separately or concurrently.

The aperture or apertures in the resulting nanostencil mask will therefore be define by the locations of the fine mask portions 205 and the positions of those portions 205 relative to the coarse structural portions 206.

The coarse structural features 206 are formed using 1 MeV to 2 MeV protons. For example, UV photolithography and a thick (e.g. 20 μm) resist, or direct writing (e.g. proton beam writing) may be used—this process may require a reapplication of resist to form a new patterned resist layer 800 of the desired thickness for formation of the coarse structural features 206 (see FIG. 8 in which a porous silicon anodization front 802 undercuts the high-fluence irradiated region 804). Such 1 MeV to 2 MeV protons have a range of 15 to 50 μm in silicon. Thus the ion energy used to form the coarse structural features 206 defines the final nanostencil thickness.

As an alternative to forming an additional resist, the resist layer 200 may be patterned in its entirety (i.e. suitable for both fine and coarse features 205, 206) before the substrate 202 is irradiated to form the fine mask features 205, and thus irradiation to form the coarse structural features 206 may follow immediately afterward. Alternatively, the resist layer 200 may include only those pattern features necessary to produce the fine mask features 205, or a subset of those features 205, and further pattern features may be formed in one or more successive patterning steps, which may or may not include additional resist layer formation steps, followed by respective irradiation steps.

With reference to FIG. 2D, once the fine and coarse features 205, 206 have been formed they must be removed from surrounding substrate material 208. To achieve this, the surrounding substrate material 208 is weakened. Weakening occurs by passing a current through the substrate 202. Since the fine and coarse features 205, 206 have higher resistivity the current preferentially passes through the surrounding substrate material 208. For a silicon wafer, this current will form porous silicon of the surrounding material 208.

Current may be applied using an electrochemical anodization process. The substrate 202 is electrochemically anodized past the end-of-range of the high-energy ions used to form the coarse structural features 206 so that the nanostencil mask features 205, 206 are completely undercut. Once anodization is at a depth greater than the end-of-range of the high-energy, high-fluence irradiated areas, anodization proceeds isotropically (i.e. in an equal rate in all directions). Therefore an irradiated coarse structural feature 206 of width $W_2$ needs to be anodized to a depth of $W_2/2$ past the end-of-range to result in a proper undercut. For example, if the coarse structural features 206 are formed using ions with an end-of-range of 15 μm in silicon, and are 20 μm wide, then the minimum anodization depth should be 25 μm (being the 15 μm end-of-range depth plus 10 μm or half of the width of the coarse structural feature 206—see FIG. 8A).

Anodizing the substrate 202 weakens the substrate 202. For a silicon wafer substrate the anodization current forms porous silicon in the material 208 surrounding the fine and coarse mask features 205, 206. Once the material 208 has been weakened it is subjected to a material removal process so that it can be removed.

Notably, while the fine mask features 205 are illustrated as having a generally round cross-section (see, e.g., FIG. 2B), the electrochemical anodization process flattens the side of the mask features 205 upstream of the electron flow E in the current—this phenomenon is illustrated in FIG. 6. As a result, the cross-section of the fine mask features 205 in the resulting nanostencil mask will be semicircular (see FIG. 2E).

FIG. 6 illustrates the effect of defect creation and the resultant increase in resistivity of irradiated p-type silicon. In particular, FIG. 6 shows that ion irradiation of a silicon substrate typically results in a reduction of the electrical hole current flowing through irradiated regions of p-type silicon during subsequent electrochemical etching, thus slowing down or completely stopping etching, leaving unetched regions, while in other etched regions porous silicon will be formed. At a low fluence, only the end-of-range region of the ion trajectories remains unetched after anodization, while the regions above and below the end-of-range region are etched. This creates a buried silicon bar 205 surrounded by porous silicon 600 after anodization (where a silicon substrate is used).

If a low fluence line is irradiated on the surface of a silicon wafer, a silicon bar will be formed along the line, but only at the end-of-range depth. Increasing line fluence produces a bar which is both wider and taller, and increasing the energy of the protons used for irradiation results in a bar being created deeper in the substrate. This approach can be used to create three-dimensional patterned surfaces and arbitrary shaped three-dimensional structures, as shown in FIGS. 7A and 7B.

In the case of FIG. 7A, 1 MeV proton irradiation with a low line fluence was used to form for end-of-range bars 700, and 2 MeV protons with a high fluence were used to form supporting walls 702, thereby resulting in a 3D free-standing structure.

The example in FIG. 7B is similar except multi-level grids were created using 1 MeV and 250 keV protons.

With further reference to FIGS. 2D and 2E, the present substrate 202 is p-type silicon and the weakened material 208 is porous silicon. Porous silicon is particularly susceptible to being dissolved by acids and bases (such as KOH). After immersion in dilute KOH the porous silicon dissolves away, leaving the nanostencil mask 210 intact and completely separated from the substrate (i.e. free-standing) as shown in FIG. 2E.

It can be particularly difficult to properly remove weakened substrate material from beneath the fine mask features 205 without damaging the fine mask features 205. One beneficial feature of using a substrate 202 comprising low resistivity, p-type silicon is that the porosity tends to be lower than that produced by similarly anodizing lower doped silicon. A lower porosity is advantageous since it minimizes the changes of the porous layer cracking as a result of stress. By minimizing cracking there is a lower likelihood that the delicate fine mask features 205 will be broken during porous silicon removal. This also means that much thicker porous layers can be produced, suitable for deeply anodizing for tens of microns to undercut the nanostencil supporting structure, and adding multiple layers of fine mask features, without cracking.

Notably, KOH dissolves porous silicon vigorously, resulting in bubbling that can damage very fine scale nanometer bars (e.g. 100 nm wide) or fine mask features 205. To protect the very fine scale nanometer features 205, after weakening of the substrate it may be mildly oxidized. Oxidization result in porous silicon being converted into silicon dioxide which can then be removed using dilute HF. This process causes no bubbling.

FIGS. 9A to 9C show some nanostencil masks fabricated by dissolving surrounding material from around the fine and coarse mask features formed using the process illustrated in FIGS. 2A to 2E.

Once the nanostencil mask 210 has been liberated from the surrounding porous silicon it is ready for use. To use the mask 210 it is inverted (see FIG. 2F) to bring its upper surface 212 in close proximity to a substrate 214 upon which material is to be deposited. Alternatively, if a large distance is required between the mask 210 and the substrate 214, the mask 210 need not be inverted.

Figure 10:
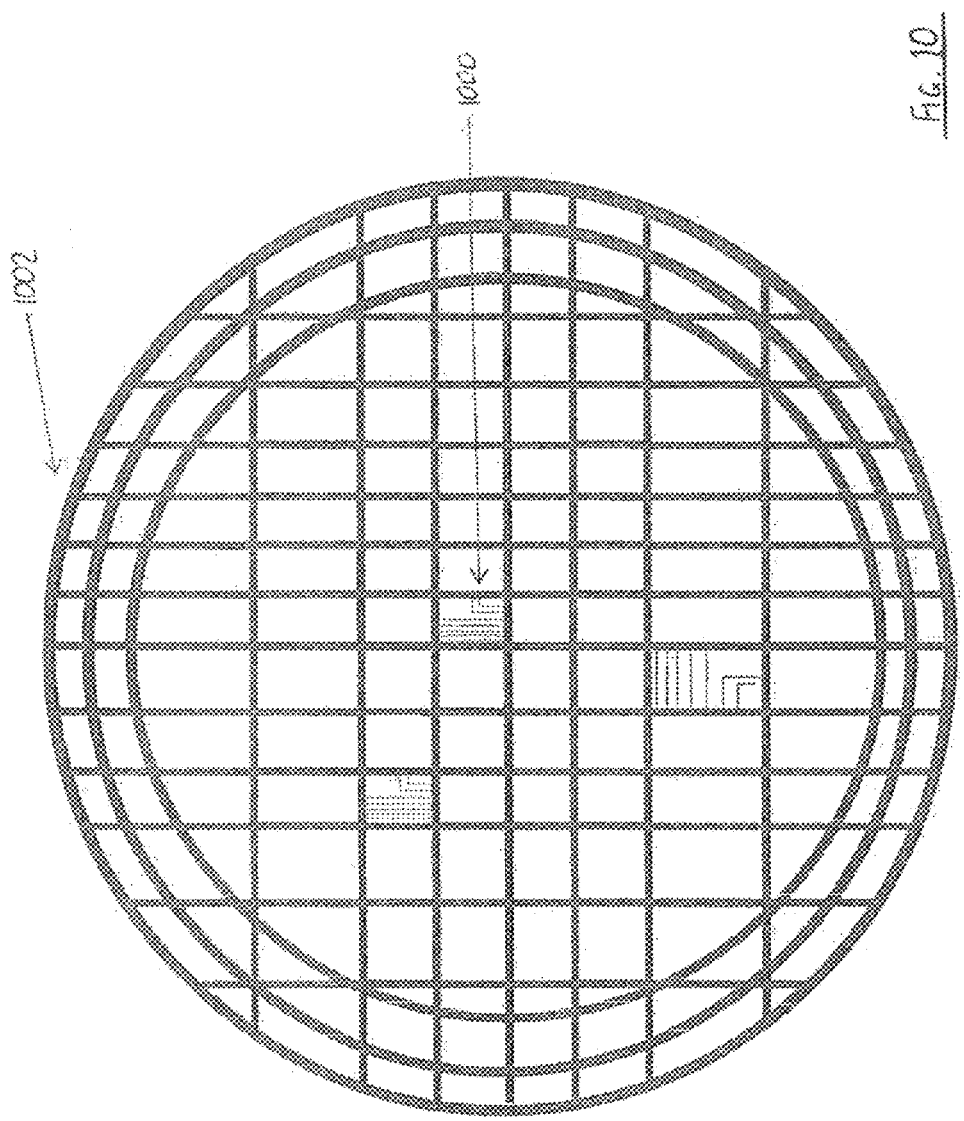
FIG. 10 is a schematic of final nanostencil mask, comprising nanoscale patterned regions supported by microscale supporting structure.

Nanostencil masks formed in accordance with present teachings may take a variety of forms as discussed above. FIG. 10 shows a schematic of a final nanostencil mask with fine nanoscale bars 1000 (being the fine mask features) written in free-standing region surrounded and supported by a thicker, coarser supporting structure 1002 (being coarse structural features). Using the process described herein, the nanostencil mask can be made as large as needed, with larger masks only requiring additional time for electron-beam writing a larger patterned array into the resist layer.

A further example of a nanostencil mask 1400 is shown in FIG. 14. In FIG. 14 a washer 1402 is used as a mean for lifting the nanostencil mask 1400 with pliers 1404. The nanostencil mask 1400 is laid over a central aperture 1406 of the washer 1402. The nanostencil mask 1400 includes a regular pattern of very fine mask portions 1408 within a larger regular pattern of supporting structural portions 1410.

While a number of steps have been described as useful in the formation of nanostencil masks in accordance with present teachings, in a broad sense, such a mask may be formed by:

irradiating a substrate to increase resistivity of a plurality of first portions of the substrate (e.g. fine mask features and coarse structural features—the term "first portion(s)" may be substituted for these features, individually or collectively, throughout the foregoing description) relative to one or more second portions of the substrate (e.g. surrounding material 208 of FIG. 2D)—there will typically be more than one first portion, but it is envisaged that, in some applications, a single first portion would be suitable;

passing a current through the substrate, the current preferentially passing through and weakening the one or more second portions of the substrate; and subjecting the substrate to a material removal process, the material removal process preferentially removing the weakened one or more second portions of the substrate and thereby forming a nanostencil mask comprising the plurality of first portions of the substrate.

Removal of the one or more second portions (i.e. material 208) results in at least one aperture 106 being formed between first portions 205, 206 of the plurality of first portions 205, 206. The aperture 106 permits passage of material 108 through the nanostencil mask during a subsequent nanostencil pattern transfer process as shown in FIG. 1

The manner in which these steps are performed is envisaged to vary as different writing, etching and other processes are developed. Moreover, some steps can occur in different sequences. For example, where two or more irradiation steps are performed, it may be possible to interchange the order of those steps or in some cases perform them concurrently. Thus no particular order is intended to be inferred where such order is not essential to the performance of the method in producing a nanostencil mask.

The above process can be extended to produce three-dimensional arrays of mask bars 205 by combining irradiation with multiple different ion energies to induce variations in the end-of-range depth. A process using two ion energies inducing periodic variations in the end-of-range depth through a patterned polymer surface mask is shown in FIGS. 12A to 12C. Electron-beam lithography is used to pattern a 1 μm thick PMMA layer on top of a 0.020 cm silicon wafer with a groove width of about 0.2 to 1 pm and a period of 1 to 2 μm. The wafer is then irradiated as shown in FIG. 12A, by 100 keV and 500 keV $H_2+$ molecular hydrogen ions. The molecular hydrogen ions dissociate to give twice the fluences of 50 keV (I2) and 250 keV (I1) protons. The PMMA resist stops the 50 keV protons so only the exposed surfaces are irradiated, resulting in an end of-range core 1200 at about 0.4 μm beneath the surface. The 250 keV proton beam penetrates the PMMA, resulting in an end of-range core 1202 at −1.7 μm beneath the wafer surface, whereas at the exposed surfaces the core region 1204 is located at a depth of −2.4 μm. This results in three layers of cores, though more may be added if a third proton energy was also used.

After etching, three levels of bars 1200, 1202, 1204 are produced with clear paths of widths of a few nanometers to some tens of nanometers between them. Even if there is no clear path through the multilevel structures, then one can be easily created by carefully thermally oxidizing the structure. After removal of the oxide in dilute HF, gap width may be increased by a few nanometers. Note that the design has certain general features, namely that narrow gaps of a few, or a few tens of nanometers can be produced, though on a period of 1 to 2 μm. It should therefore be possible to pattern narrow lines. It would be more difficult to pattern a dense array of narrow lines in this manner.

The processes described above are counter-intuitive for a number of reasons. Firstly, irradiation introduces defects into the substrate. A skilled person would typically expect to remove regions of a substrate in which defects are concentrated. This is because the skilled person is attempting to produce a stable, rigid structure on a nano-scale. However, in the present process the altered properties (e.g. resistivity) of defect rich regions results in the retention of those regions to form the nanostencil mask, and the removal of regions that have fewer defects after the irradiation process. Secondly, the present process focuses on forming the bars and support features rather than forming the apertures per se. In traditional nanostencil mask fabrication the skilled person would form apertures in the substrate by material removal. The size of the apertures is dictated purely by the control of the material removal process. In the present process the pattern results from forming the bars and supports, and growing those bars and supports to narrow the spacing therebetween. This spacing becomes the apertures after the weakened substrate material is removed by an easily manageable material removal process. In other words, in traditional nanostencil fabrication the apertures are grown (i.e. increase in size) until the desired pattern is formed, whereas the present method grows the mask structure (i.e. decreases aperture size) until the apertures are reduced to the desired size. Thirdly, in traditional nanostencil fabrication smaller apertures require less electron-beam lithography (and other processes). In the present method, to reduce aperture size the fine mask features 205 must become larger. This warrants an increase in line fluence which means the amount of electron-beam lithography used to create the nanostencil mask is, in a general sense, inversely proportional to the aperture size.

From the foregoing description it will be understood that methods, in accordance with present teachings, for fabricating nanostencil masks and nanostencil masks formed by such methods provide a path to fabricating small apertures for nanostencil lithography based on, for example, bulk silicon wafers, which are much cheaper than silicon nitride on silicon wafers.

The methods of the present teachings are capable of fabricating apertures down to 10 nm for Nanostencil lithography, since the aperture size is not limited by geometrical considerations of aspect ratio, which limits what is achievable using conventional patterning processes in silicon nitride membranes of 100 nm thickness.

The distance between the nanoscale apertures and substrate surface can be defined during mask fabrication using the present methods. The distance can be made as large as 200 nm, and as small as zero. This helps to reduce and control blurring associated with the pattern transfer across larger distances.

The cross-section profile of the bars (i.e. plurality of first portions and/or one or more second portions) defining the small apertures is not rectangular, rather they are curved. The bars may reach a thickness up to 400 nm at the thickest, central part. The bars thus provide great rigidity to the patterned aperture array, removing the need to fabricate supporting spars as for silicon nitride based membranes.

Using a modified form of this process as described above, it is possible to fabricate 3D nanostencil features. Such 3D features may have a very small clear opening through of about ten nanometers. Furthermore, such a 3D structure can transfer a nanoscale pattern with very little blurring due to a gap between the stencil and the sample surface.

A 3-dimensional structure such as that shown in FIG. 12A, or 3-dimensional bar geometry, can be used to remove incident particles that have significant divergence from a transmitted particle beam trajectory. As a result. The beam becomes highly collimated in angle as well as in position.

This process can be characterized using a phase space representation. This concept is encountered in charged particle optics. Phase space representation represents a distribution of moving particles within the framework of a six dimensional phase space volume of position coordinates x,y,z, and the three angular coordinates x', y', z' with respect to these position coordinates. Such a representation can provide a useful framework for characterizing the effects of electromagnetic lenses and accelerating elements on the distribution and emittance of charged particles. It can also be used to describe the passage of particles through crystalline materials.

Described below is a 1-dimensional phase space representation using the position x and angular coordinate x' of each particle across an array (1300, 1302, 1304) of parallel bars of a nanostencil. We respectively define the beam phase distribution immediately before and after the first array 1300 of bars as $(x_{1o}, x_{1o'})$ and $(x_{1i}, x_{1i'})$, the notation corresponding to the object and image sides of each array or level 1300, 1302, 1304 of bars.

Figure 13A:
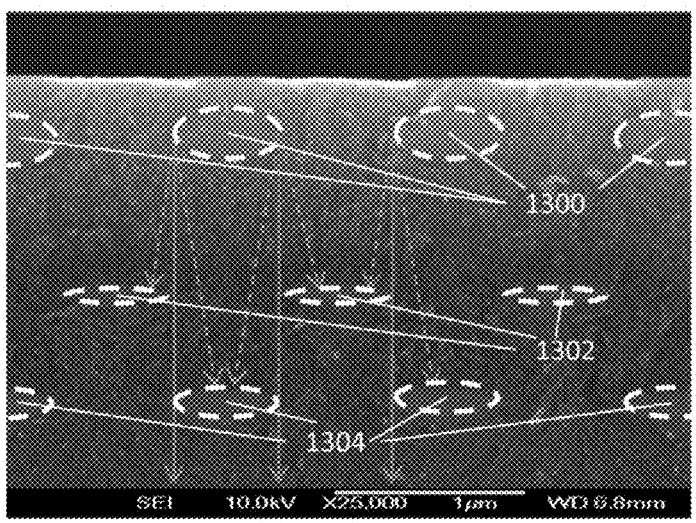
FIG. 13A to 13G show a photograph of a 3-dimensional structure otherwise shown schematically in FIG. 12A (see FIG. 13A), and the particle beam phase distribution immediately before and after each successive row of mask features in the 3-dimensional structure of FIG. 13A (see FIGS. 13B to 13G)
Figure 13B:
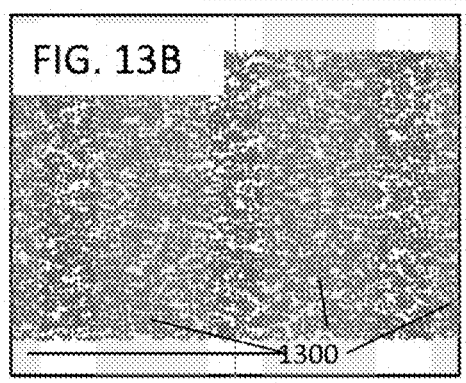

At the stencil surface the phase space distribution of particles is uniformly filled—see FIG. 13B. The beam is distributed over the stencil surface with an angular range which is typically defined by the source size and distance to the stencil. In this case the source has a large angular spread of ±15° to illustrate how the multilevel structure allows only those particles with very low divergence to be transmitted.

The nanostencil geometry simulated here comprises three rows or arrays (1300, 1302, 1304) of bars, similar to that shown in FIG. 12A. In the simulations each level (1300, 1302, 1304) is separated in depth by 500 nm. The bar locations are indicated in the phase space maps as the lighter shaded regions and the particles as the heavier shaded region(s).

Across the first level of bars 1300 (see FIGS. 13B and 13C) and third level of bars 1304 (see FIGS. 13F and 13G), located at the same lateral positions but at a different depth, the bars have a gap of 400 nm between them. They are centrally located across the 2 μm width of the phase space maps as shown in the figures.

The second level of bars 1302 (see FIGS. 13D and 13E) comprises bars which are 360 nm wide, centered on the gaps in the upper & lower levels, resulting in open gaps of 20 nm through the full three level structure.

Figure 13C:
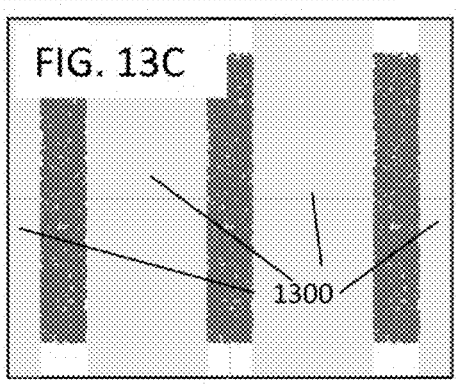
Figure 13D:
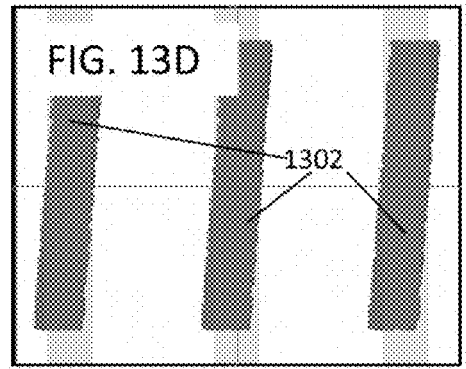
Figure 13E:
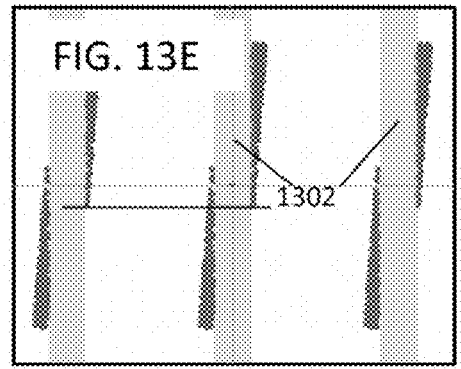

Only those particles with a trajectory with a position within the gap are transferred from the object to the image side of the stencil row (at bottom of respective figure), while those with position coordinates overlapping the arrays 1300, 1302, 1304 of bars are stopped. Those trajectories within the three vertical running bands in the phase space map of FIG. 13C are transmitted through the gaps in the first level 1300 of bars then drift a distance of $z_{12}$ to the second level 1302 of bars. The phase space coordinates are thus transformed according to:

$$\begin{pmatrix} x_2 \\ x_2' \end{pmatrix} = \begin{pmatrix} 1 & z_{12} \\ 0 & 1 \end{pmatrix} \begin{pmatrix} x_1 \\ x_1' \end{pmatrix}$$

The angular coordinate of each particle is unchanged, but the position coordinates are sheered within the phase space map at the second row 1302 of bars, distributed over larger widths compared to the distribution exiting the gaps between the first level 1300 of bars. The bars of the second level 1302 remove the central beam portion, leaving only triangular shaped phase space regions which still contain highly divergent trajectories in the map shown in FIG. 13E.

Figure 13F:
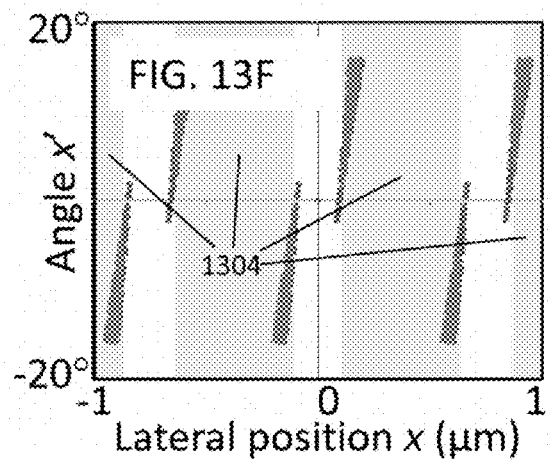

Those trajectories transmitted through the gaps in the second level 1302 of bars then drift to the third level 1304 of bars, shown in the map of FIG. 13F. This results in the phase space distribution being further skewed.

Figure 13G:
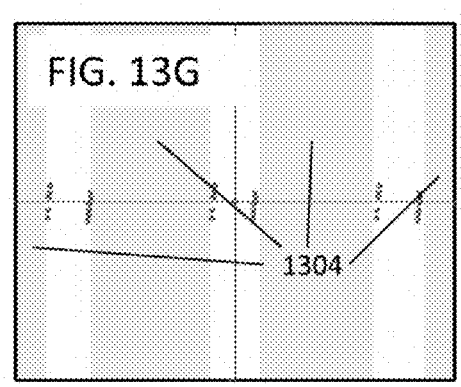

All remaining highly-divergent trajectories intersect the bars of the third level 1304, leaving only narrow widths of 20 nm for the beam to exit the stencil with low divergence in the map of FIG. 13G. There is a slight asymmetry in the left and right side distributions, owing to the way the 3D structure collimates first beam particles with angle to one side, then the other wide, at different depths.

In this way, a highly-divergent beam distribution at the surface is filtered in both position and angle to produce a highly-collimated transmitted distribution which is not sensitive to small gaps between the stencil exit surface and the sample surface.

The invention claimed is:

1. A method for forming a nanostencil mask, comprising:
   irradiating a substrate to increase resistivity of a plurality of first portions of the substrate relative to one or more second portions of the substrate surrounding the plurality of first portions;
   passing a current through the substrate, the current preferentially passing through and weakening the one or more second portions of the substrate; and
   subjecting the substrate to a material removal process, the material removal process preferentially removing the weakened one or more second portions of the substrate and thereby forming a nanostencil mask comprising the plurality of first portions of the substrate.

2. A method according to claim 1, wherein removal of the one or more second portions of the substrate results in at least one aperture being formed between first portions of the plurality of first portions.

3. A method according to claim 2, wherein the aperture permits passage of material through the nanostencil mask during a subsequent nanostencil pattern transfer process.

4. A method according to claim 1, wherein the irradiating step involves irradiating a pattern into the substrate, the pattern comprising the plurality of first portions of the substrate.

5. A method according to claim 1, wherein the irradiating step is performed using ion irradiation.

6. A method according to claim 5, wherein the ion irradiation uses ions with an energy of 50 keV or greater.

7. A method according to claim 5, wherein the plurality of first portions are formed at an end-of-range region of the ion irradiation.

8. A method according to claim 1, wherein the irradiating step involves irradiating the substrate to form defects in the plurality of first portions of the substrate and thereby increase the resistivity of the plurality of first portions of the substrate.

9. A method according to claim 1, wherein the irradiating step comprises controlling an irradiation energy to control a depth, in the substrate, at which the plurality of first portions are formed.

10. A method according to claim 1, wherein the irradiating step comprises controlling an irradiation line fluence to control a size of each first portion in the plurality of first portions of the substrate.

11. A method according to claim 10, wherein each of first portions of the plurality of first portions is elongate and the size is measured tangentially to a longitudinal direction of respective ones or the plurality of first portions of the substrate.

12. A method according to claim 1, wherein the irradiation line fluence is controlled to control a size of a gap between neighboring ones of the plurality of first portions of the substrate.

13. A method according to claim 2, wherein the plurality of first portions include one or more fine mask portions for defining the at least one aperture in the nanostencil mask, and one or more support structure portions for supporting the one or more fine mask portions, and the irradiating step comprises a first irradiating process in which the substrate is irradiated using ions of a first energy level to form the fine mask portions and a second irradiating process in which the substrate is irradiated using ions of a second energy level to form the support structure portions.

14. A method according to claim 13, wherein an irradiation line fluence of the second irradiating process is higher an irradiation line fluence of the first irradiating process.

15. A method according to claim 13, wherein the first irradiation process uses ions with an energy of around 50 keV.

16. A method according to claim 1, wherein weakening the substrate comprises forming pores in the substrate.

17. A method according to claim 1, wherein passing a current through the substrate forms pores in, and thereby weakens, the one or more second portions of the substrate, and the irradiating step comprises irradiating the substrate using a irradiation line fluence high enough to at least partially stop pores forming in the plurality of first portions of the substrate when the current is passed through the substrate.

18. A method according to claim 1, wherein the step of passing a current through the substrate comprises electrochemically anodizing the substrate.

19. A method according to claim 1, wherein the irradiating step involves irradiating the substrate through a pattern of a patterned resist layer.

20. A nanostencil mask formed using the method of claim 1, wherein the plurality of first portions form substantially semi-circular members.

* * * * *